US012646681B2

(12) United States Patent
Verwimp et al.

(10) Patent No.: US 12,646,681 B2
(45) Date of Patent: Jun. 2, 2026

(54) CLAMPING MECHANISM

(71) Applicant: FEI Company, Hillsboro, OR (US)

(72) Inventors: Nick Verwimp, Eindhoven (NL); Nick Van Gestel, Retie (BE)

(73) Assignee: FEI Company, Hillsboro, OR (US)

( * ) Notice: Subject to any disclaimer, the term of this patent is extended or adjusted under 35 U.S.C. 154(b) by 335 days.

(21) Appl. No.: 18/365,746

(22) Filed: Aug. 4, 2023

(65) Prior Publication Data

US 2024/0047172 A1 Feb. 8, 2024

(30) Foreign Application Priority Data

Aug. 5, 2022 (EP) ..................................... 22189057

(51) Int. Cl.
*H01J 37/20* (2006.01)
*G01N 23/20025* (2018.01)
*H01J 37/26* (2006.01)

(52) U.S. Cl.
CPC ........ *H01J 37/20* (2013.01); *G01N 23/20025* (2013.01); *H01J 2237/2007* (2013.01)

(58) Field of Classification Search
None
See application file for complete search history.

(56) References Cited

U.S. PATENT DOCUMENTS

2007/0029481 A1* 2/2007 Morrison ................ H01J 37/20
                                                  250/311
2020/0273659 A1* 8/2020 van den Boogaard . H01J 37/20

OTHER PUBLICATIONS

W. H. Escovitz, T. R. Fox and R. Levi-Setti, Scanning Transmission Ion Microscope with a Field Ion Source, Proc. Nat. Acad. Sci. USA 72(5), pp. 1826-1828, Feb. 24, 1975, (3 pages).
CompuStage in TEM's supplied by FEI Company, "Compustage for CM and Tecnai TEM. FEI-Philips TEM Part", SemiStar Corp., <http://www.semistarcorp.com/product/compustage-cm-tecnai-tem-fei-philips-tem-part/>, webpage accessed on Nov. 29, 2023, (13 pages).
Wikipedia contributors, (Nov. 20, 2023), Electron microscope, In Wikipedia, The Free Encyclopedia, from <https://en.wikipedia.org/w/index.php?title=Electron_microscope&oldid=1186049066>, (14 pages).
Wikipedia contributors, Scanning electron microscope, Wikipedia, The Free Encyclopedia, Nov. 25, 2023, <https://en.wikipedia.org/w/index.php?title=Scanning_electron_microscope&oldid=1186781991>, (27 pages).
Wikipedia contributors. Transmission electron microscopy. Wikipedia, The Free Encyclopedia. Nov. 26, 2023, <https://en.wikipedia.org/w/index.php?title=Transmission_electron_microscopy&oldid=1186926286>, (34 pages).
Wikipedia contributors, Scanning transmission electron micros-copy, Wikipedia, The Free Encyclopedia. Sep. 28, 2023, <https://en.wikipedia.org/w/index.php?title=Scanning_transmission_electron_microscopy&oldid=1177611158>, (12 pages).

(Continued)

*Primary Examiner* — Eliza W Osenbaugh-Stewart
(74) *Attorney, Agent, or Firm* — Michael Best & Friedrich LLP

(57) ABSTRACT

The invention relates to a sample holder tip for use in a charged particle microscope, such as a transmission electron microscope; a sample holder comprising said sample holder tip and methods of using said sample holder tip and sample holder.

16 Claims, 5 Drawing Sheets

(56)     References Cited

OTHER PUBLICATIONS

Wikipedia contributors, Scanning helium ion microscope, Wikipedia, The Free Encyclopedia, Sep. 21, 2023, <https://en.wikipedia.org/w/index.php?title=Scanning_helium_ion_microscope&oldid=1176365337>, (2 pages).

Chen, Fei Tecnai G22 F20 S-Twin TEM—Training Manual, Dec. 2018, Missouri University of Science and Technology (44 pages).

E.A. Fischione Instruments Inc. Model 2560 Vacuum Transfer Tomography Holder, Nov. 2018, Lambda Photometrics Limited (4 pages).

Dr. Wei-Ting Chen, Fei Tecnai G2 F20 S-Twin TEM—Training Manual, 44 pages, Dec. 2018, Missouri University of Science and Technology.†

E.A. Fischione Instruments Inc., Model 2560 Vacuum Transfer Tomography Holder, 4 pages, Nov. 2018, Lambda Photometrics Limited.†

* cited by examiner
† cited by third party

102a

102b

CLAMPING MECHANISM

CROSS REFERENCE TO RELATED APPLICATIONS

This application claims priority to European Application No. EP22189057.7, filed Aug. 5, 2022, the entire contents of which is herein incorporated by reference.

The invention relates to a sample holder tip for use in a charged particle microscope, such as a transmission electron microscope; a sample holder comprising said sample holder tip and methods of using said sample holder tip and sample holder.

BACKGROUND OF THE INVENTION

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:

In a SEM, irradiation of a sample by a scanning electron beam precipitates emanation of "auxiliary" radiation from the sample, in the form of secondary electrons, backscattered electrons, X-rays and photoluminescence (infrared, visible and/or ultraviolet photons), for example; one or more components of this flux of emanating radiation is/are then detected and used for image accumulation purposes.

In a TEM, the electron beam used to irradiate the sample is chosen to be of a high-enough energy to penetrate the sample (which, to this end, will generally be thinner than in the case of a SEM sample); the flux of transmitted electrons emanating from the sample can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:

http://en.wikipedia.org/wiki/Electron_microscope
http://en.wikipedia.org/wiki/Scanning_electron_microscope
http://en.wikipedia.org/wiki/Transmission_electron_microscopy
http://en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards ion-based microscopy, some further information can, for example, be gleaned from sources such as the following:

http://en.wikipedia.org/wiki/Scanning_Helium_Ion_Microscope

W. H. Escovitz, T. R. Fox and R. Levi-Setti, Scanning Transmission Ion Microscope with a Field Ion Source, Proc. Nat. Acad. Sci. USA 72 (5), pp. 1826-1828 (1975).

It should be noted that, in addition to imaging, a charged particle microscope may also have other functionalities, such as performing spectroscopy, examining diffractograms, performing (localized) surface modification (e.g. milling, etching, deposition), etc.

In all cases, a Charged Particle Microscope (CPM) will comprise at least the following components:

A radiation source, such as a Schottky electron source or ion gun.

An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-)optical component also. If desired, the illuminator can be provided with a deflector system that can be invoked to cause its output beam to perform a scanning motion across the sample being investigated.

A sample holder, on which a sample under investigation can be held and positioned (e.g. tilted, rotated). If desired, this holder can be moved so as to effect scanning motion of the beam w.r.t. the sample. In general, such a sample holder will be connected to a positioning system such as a mechanical stage.

A detector (for detecting radiation emanating from an irradiated sample), which may be unitary or compound/distributed in nature, and which can take many different forms, depending on the radiation being detected. Examples include photomultipliers (including solid state photomultipliers, SSPMs), photodiodes, CMOS detectors, CCD detectors, photovoltaic cells, etc., which may, for example, be used in conjunction with a scintillator film, for instance.

In the case of a transmission-type microscope (such as a (S)TEM, for example), the CPM will also comprise:

An imaging system, which essentially takes charged particles that are transmitted through a sample (plane) and directs (focuses) them onto analysis apparatus, such as a detection/imaging device, spectroscopic apparatus (such as an EELS module), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy. However, such simplification is intended solely for clarity/illustrative purposes and should not be interpreted as limiting.

A sample under investigation in a CPM is generally located in a very cramped space, in very close proximity to the terminal optical elements of the CPM's illuminator. In the case of a dual-beam CPM, this situation is exacerbated by the fact that there are two optical columns—e.g. one for electrons and one for ions—which converge (from different directions) at the sample, thereby causing even greater cramping. In addition, the CPM may employ a gas injection system and/or micromanipulator(s), which will further crowd the vicinity of the sample. In the case of a transmission-type CPM, available space is even more confined, since the first optical elements of the imaging system are located just below the sample. Such cramped conditions have led to the development of rod-like sample holders, on which a sample mounting zone is located at/near one extremity (second end) of a relatively thin elongated member, which is fine enough to be introduced laterally (so called "side entry") into the cramped sample space described above. The other extremity (first end) of this elongated member is connected to a support structure (e.g. a simple structure such as a knob or handle, or a composite structure comprising, for example, a dewar for containing a cryogenic coolant), and this support structure is generally intended to remain outside a retaining wall of the CPM's vacuum enclosure while said connected elongated member protrudes through an aperture in said wall. In many such cases, a portion of the elongated member inside the CPM will seat into a cradle that is connected to an actuator system (e.g. the so-called CompuStage in TEMs supplied by FEI Company), allowing the elongated member (and a sample mounted thereon) to be positioned/moved in multiple degrees of freedom relative to the/an optical axis of the CPM. To aid clarity, a Cartesian coordinate system will be adhered to in this discussion, in which:

The (longitudinal axis of the) elongated member extends along the X direction;

The/an optical axis of interest in a particular investigation extends (temporarily) along the Z direction.

In such a system, said actuated cradle will, for example, be positionable in X, Y, Z. It will also often be positionable in Rx (rotation about X, also called alpha tilt or roll), e.g. so as to allow a tilt series (sinogram) to be acquired during (TEM) tomography. In multi-beam (e.g. dual-beam) CPMs in which a plurality of particle-optical axes (co-planar in a plane O) converge on a sample space, the elongated member of the sample holder is conventionally arranged to as to extend perpendicular to O; in this way, Rx (alpha tilt) positioning can be used to "present" an exposed surface of a clamped sample to a given particle-optical axis, at will.

In addition to imaging, an important aspect of working with a CPM is sample preparation. This is particularly (though not exclusively) the case in transmission-type CPMs, in which the sample will generally be extremely thin (e.g. of the order of 1-100 nm), consequently relatively brittle/delicate, and therefore (very) difficult to work with.

Once such a sample is (precariously) mounted on the (sample mounting zone of the) holder (e.g. using adhesive, or a mechanical clamping mechanism/member, such as a clip, flange, screw, etc.), it is highly desirable not to have to demount it until strictly necessary. Nevertheless, after mounting, many operations (alterations, finishing) may have to be performed on the sample, such as ion milling, ion-beam-induced deposition (IBID), electron-beam-induced deposition (EBID), etc., for purposes of thinning, surface modification, etc. Many such functionalities can be made available in situ in a CPM, but their applicability/usefulness is limited in many situations by sub-optimal manipulability of the sample holder.

Typically, sample holders or carriers presently used are clamped within a tomography holder by placing a "clamping plate" or "clamping finger" on the sample, which is kept in place by a screw. These holders are typically very long and have the "clamping plate" or "clamping finger" features on two side of the sample which are not connected to each other. In view of this they typically require special tooling/ additional components. Further, none of the known holders are able to clamp over the full perimeter of the sample.

In this context, the current inventors have worked extensively to identify shortcomings in conventional holder designs, and to address these effectively so as to produce better performance. The results of this endeavour are the subject of the current invention.

The listing or discussion of an apparently prior-published document in this specification should not necessarily be taken as an acknowledgement that the document is part of the state of the art or is common general knowledge.

In the case of the present invention, the inventors have found that providing a sample holder tip where the clamping means is situated to a single side of the sample and the clamping arm(s) of the clamping means are integrated with the sample receiving zone has at last the following advantages:

A reduced need for special tools and no loose parts enhancing user friendliness (regular tweezers can be used to load/unload a sample);

A reduction in the tip geometry significantly reducing the external profile which maximises sample visibility at very high alpha tilt angles and enables a high unshaded solid angle.

A high clamping force; and

Good contact with the sample.

DESCRIPTION OF THE INVENTION

The present invention therefore provides a sample holder tip for use in a charged particle microscope, wherein the sample holder tip comprises:

An elongated member having a proximal and a distal end, wherein a sample receiving zone for releasably receiving a sample is provided near the distal end of the elongated member; and A clamping mechanism for fixing the sample in said sample receiving zone of said elongated member, wherein the clamping mechanism is moveably connected to the elongated member and comprises at least a first clamping arm with a distal and proximal end, wherein the clamping arm is movable between a closed and open position, wherein in the open position said sample can be placed in or removed from said sample receiving zone, and when in said closed position said sample can be locked in said sample receiving zone; characterised in that the first clamping arm is moveably connected to the elongated member at the proximal end of the elongated member.

The sample holder tip of the invention is hereinafter referred to as the "sample holder tip" or "tip".

As used herein, the elongated member may refer to an elongated rod. That is the member may be in the form of a rod.

In the tip of the invention, the sample may be placed directly in the sample receiving zone or may be place in a sample carrier before being placed in the sample receiving zone.

As used herein, the sample receiving zone may be a recess in the elongated member or a specific zone or space on the member configured to receive a sample or sample carrier.

The sample receiving zone is located at the distal end of the elongated member. The sample receiving zone may be any shape suitable for receiving a sample or sample carrier. For example, the sample receiving zone may be substantially circular and/or configured to receive a substantially circular sample carrier, i.e. the sample receiving zone may be a substantially circular recess at the distal end of the elongated member.

The elongated member may be formed of any material suitable for use in a charged particle microscope. For example, materials that the elongated member may be formed of include, but are not limited, to phosphorus bronze (CuSn8/CuSn6), Aluminum Bronze (CuAl8), Aluminum, Beryllium.

The clamping mechanism is moveably connected to the proximal end of the elongated member.

The clamping mechanism comprises at least a first clamping arm but may comprise further clamping arms depending on the configuration of the clamping mechanism.

For example, in a preferred aspect, the clamping mechanism may comprise a first and a second clamping arm. In certain aspects, the second claiming arm may be situated within the first clamping arm such that it appears only one clamping arm is present.

The at least a first clamping arm and any subsequent clamping arms, i.e. the second clamping arm, is moveably connected to the elongated member at the proximal end of the elongated member. That is the connection between the clamping arm or arms is at the opposite end of the elongated member to the sample receiving zone. This means that the clamping arm or arms come from a single side relative to the sample receiving zone.

The clamping arm or arms are moveable between a closed and open position. In the open position the sample or sample carrier can be placed into or on the sample receiving zone. In the closed position the sample can be locked in or on the sample receiving zone.

The distal end of the clamping arm or arms may be configured to sit within the sample receiving zone. Typically, this may be when the sample receiving zone is a recess within the distal end of the elongated member.

The distal end fitting within the sample receiving zone allows for a clamping force to be provided against the perimeter of the sample or sample cartridge where the distal end is within the sample receiving zone when the at least first clamping arm is in the closed position.

The phrase "configured to sit within" is intended to mean that when in the closed position at least a portion of the distal end, fits substantially within the sample receiving zone such the distal end is flush with the sample receiving zone. For example, when viewed from the side, the distal end of the clamping arm or arms cannot be seen above the sample receiving zone.

In some aspects, the distal end of the first clamping arm may have at least a portion of the distal end configured to sit within the sample receiving zone, such as at least half of the distal end configured to sit within the sample receiving zone.

In a further aspect, the distal end of the second clamping arm may be configured to sit within the sample receiving zone.

In some aspects, the distal end of the first and second clamping arms may combine to provide a clamping force on substantially the full perimeter of the sample or sample carrier when in the closed position. For example, the first clamping arm may provide a clamping force against from about 60% to about 80% of the perimeter of the sample and the second clamping arm may provide a clamping force against from about 20% to about 40% of the perimeter of the sample. The term "full perimeter" includes the situation where they may be small gaps in the part of distal end of the at least one clamping arm that provides pressure to the perimeter of the sample but the small gaps do not affect the clamping force provided.

Thus, the distal end of the clamping arm or arms may have a shape that is substantially the same as the sample receiving zone. For example, the distal end of the clamping arms may be circular or substantially circular, or distal end of the first and second clamping arms may combine together to form substantially the same shape as the sample receiving zone.

The clamping mechanism may be formed of any material suitable for use as a sample holder in a charged particle microscope. For example, the clamping mechanism may be formed of similar materials as those used for the elongated member.

The tip is not limited by its connection to a stage or microscope. Therefore, the tip may be connected to a charged particle microscope using any suitable means. For example, the tip may be connected to a stage in the charged particle microscope by a rod type body or a cartridge type body as required.

For example, the tip could be coupled directly to a stage, or connected to a stage by a rod type body, or connected to a stage by a rod type body in combination with any shape of adapted to not be limited to the type of stage.

The tip may comprise a spring element. For example, the clamping mechanism, i.e. the first or first and second clamping arms may be moveably connected to a spring, such as a leaf spring. The spring may press against a body between the spring and the clamping mechanism, for example the first or first and second clamping arms, thereby providing a clamping force against the perimeter of the sample or sample carrier when the clamping arm or arms are in the closed position. For example, the spring may be arranged to urge the first or first and second clamping arms towards the closed position.

The spring may also be arranged such that it can maintain the clamp in an open position. For example, the spring may be arranged such that when the clamp is positioned more than 20 degrees open from the closed position, the pressure provided by the spring on the body maintains the clamp in an open position, thereby aiding loading of the sample into the sample receiving zone.

The spring may provide from about 0.5N to about 1.0N force, for example from about 0.7N to about 0.9N or about 0.8N of force to the perimeter of the sample or sample carrier.

The combination of the spring mechanism and clamping mechanism as defined allows for good contact between the sample over a variety of sample thicknesses removing the need for thickness compensation by spacers.

The tip may be pivotable between said open and said closed position. Pivoting the clamping mechanism allows for a compact construction as well as easy manipulation of the clamping arm or arms, for example, regular tweezers may be used.

The clamping force may be varied by the position of the rotation point, the length of the clamping arm or arms and the contact point between the elongated member and the clamping arm or arms.

In an aspect of the invention, the first clamping arm and the second clamping arm may have the same pivot point. Alternatively, the first clamping arm and second clamping arm may have a different clamping point. For example, the pivot point of the second clamping arm may be located between the proximal and distal ends of the first clamping arm, i.e. the middle of the first clamping arm.

This allows for the second clamping arm to provide a different clamping force to the perimeter of the sample or sample carrier.

Due to the minimal number of parts and lack of loose parts, attachment can be performed in a fast and reliable manner by simply moving the clamp to the open position, placing the sample in the sample receiving zone and moving the clamp to the closed position.

The present invention also provides a sample holder comprising a sample holder tip as defined above.

The sample holder tip and/or sample holder defined in this application is for use in a charged particle microscope. Thus, the present invention also provides a charged particle microscope comprising a radiation source, an illuminator, a sample holder or tip according to the present disclosure, and a detector.

The present invention also provides a method of placing a sample in the sample holder or tip as defined previously, wherein the method comprises the steps of moving said clamp to said open position, placing said sample in said sample receiving zone of said sample holder or tip, and moving said clamp to said closed position.

A tool may be used for placing said sample in said sample receiving zone of said sample holder or tip. Said tool may for example be a tweezer like tool.

The sample holder as defined above may be used in a method of the invention as defined herein.

For the avoidance of doubt, in this specification when we use the term "comprising" or "comprises" we mean that the feature being described must contain the listed component(s) but may optionally contain additional components. When we use the term "consisting essentially of" or "consists essentially of" we mean that the feature being described must contain the listed component(s) and may also contain other components provided that any components do not affect the essential properties of the feature. When we use the term "consisting of" or "consists of" we mean that the feature being described must contain the listed component(s) only.

It would be clear to the person skilled in the art that the features and combinations defined with respect to the charged particle microscope, apply equally to the method and combination defined above.

The drawings, which are not necessarily to scale, depict selected embodiments and are not intended to limit the scope of the invention. The detailed description illustrates, by way of example, not by way of limitation, the principles of the invention. The description will clearly enable one skilled in the art to make and use the invention, and described several embodiments, adaptions, variations, alternatives and uses of the invention. As used herein, the terms "about" or "approximately" for any numerical values or ranges indicate a suitable dimensional tolerance that allows the part or collection of components to functions for its intended purpose as described.

BRIEF DESCRIPTION OF THE DRAWINGS

The invention will next be explained by reference to the accompanying drawings, which show several embodiments of the sample holder as described herein. In the figures.

DETAILED DESCRIPTION OF THE INVENTION

The sample holder tip and method of the invention will be defined in more detail by reference to the Figures. The drawings, which are not necessarily to scale, depict selected embodiments and are not intended to limit the scope of the invention. The detailed description illustrates, by way of example, not by way of limitation, the principles of the invention. The description will clearly enable one skilled in the art to make and use the invention, and described several embodiments, adaptions, variations, alternatives and uses of the invention. As used herein, the terms "about" or "approximately" for any numerical values or ranges indicate a suitable dimensional tolerance that allows the part or collection of components to functions for its intended purpose as described.

Figure 1:
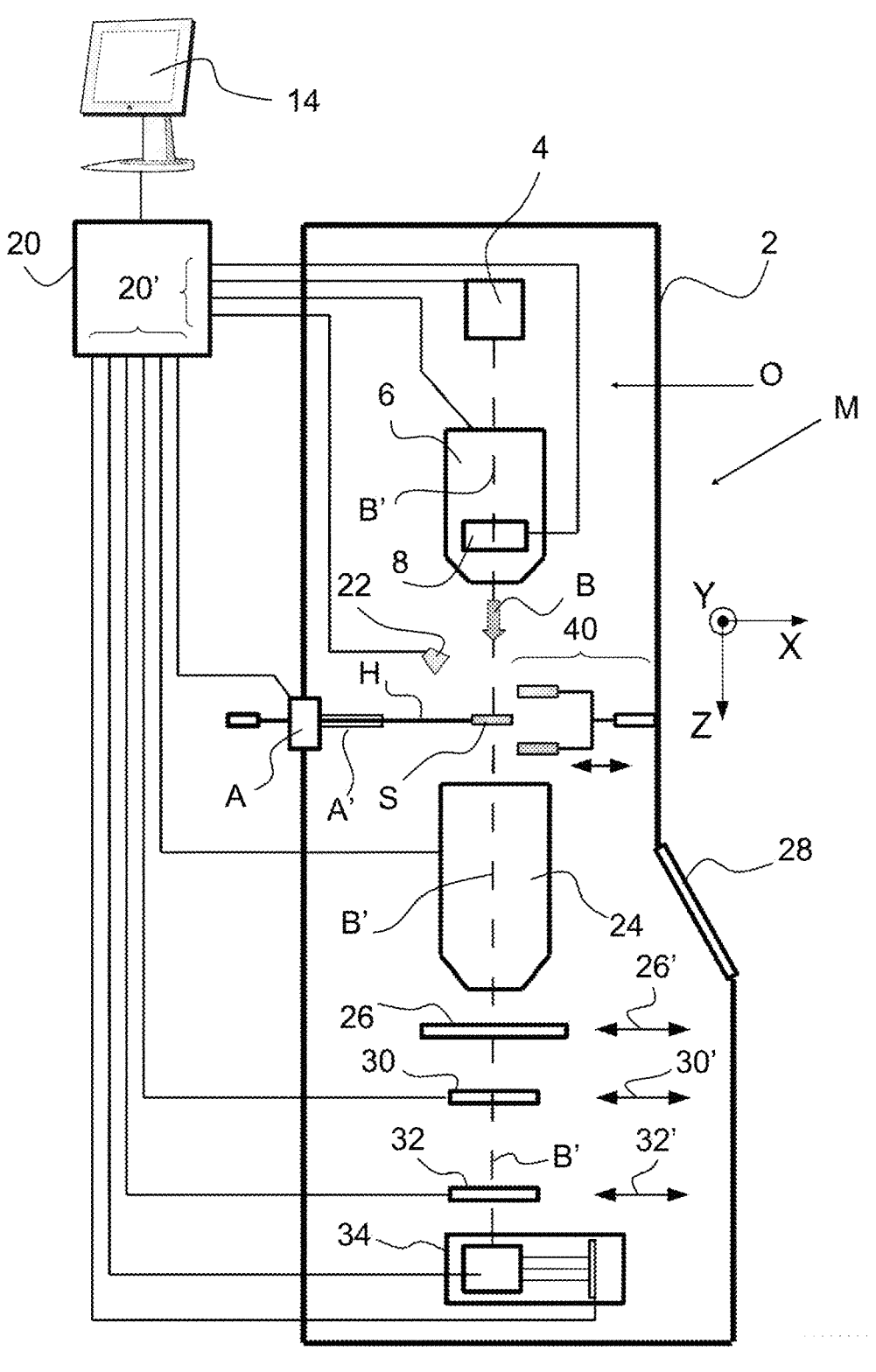
FIG. 1 is a schematic overview of a charged particle microscope.

FIG. 1 (not to scale) is a highly schematic depiction of an embodiment of a charged-particle microscope M in which the sample holder as disclosed herein can be used. More specifically, FIG. 1 shows an embodiment of a transmission-type microscope M, which, in this case, is a TEM/STEM (though, in the context of the current invention, it could just as validly be a SEM, or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a sample S (which may, for example, be (locally) thinned/planarized). Also depicted is a deflector 8, which (inter alia) can be used to effect scanning motion of the beam B.

The sample S is held on a sample carrier C (not shown) that is mounted to sample holder H, and this sample holder H can be positioned in multiple degrees of freedom by a positioning device A, which moves a stage A' into which holder H is (removably) affixed; for example, the sample holder H may comprise a finger that can be moved (inter alia) in the XY plane (see the depicted Cartesian coordinate system; typically, motion parallel to Z and tilt about X/Y (so called alpha tilt/beta tilt, respectively). Such movement allows different parts of the sample S to be illuminated/imaged/inspected by the electron beam B traveling along axis B' (in the Z direction) (and/or allows scanning motion to be performed, as an alternative to beam scanning). If desired, a cooling device (not depicted, but known to those skilled in the art) can be brought into intimate thermal contact with the sample holder H, so as to maintain it (and the sample S thereupon) at cryogenic temperatures, for example.

The electron beam B will interact with the sample S in such a manner as to cause various types of "stimulated" radiation to emanate from the sample S, including (for example) secondary electrons, backscattered electrons, X-rays and optical radiation (cathodoluminescence). If desired, one or more of these radiation types can be detected with the aid of detector device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the sample S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the sample S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the sample S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. 106 points per second) than camera 30 (e.g. 102 images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the sample along different lines of sight, so as to acquire penetrative observations of the sample from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, sample holder H, screen 26, camera 30, camera 32, spectroscopic apparatus 34, etc.

Figure 2:
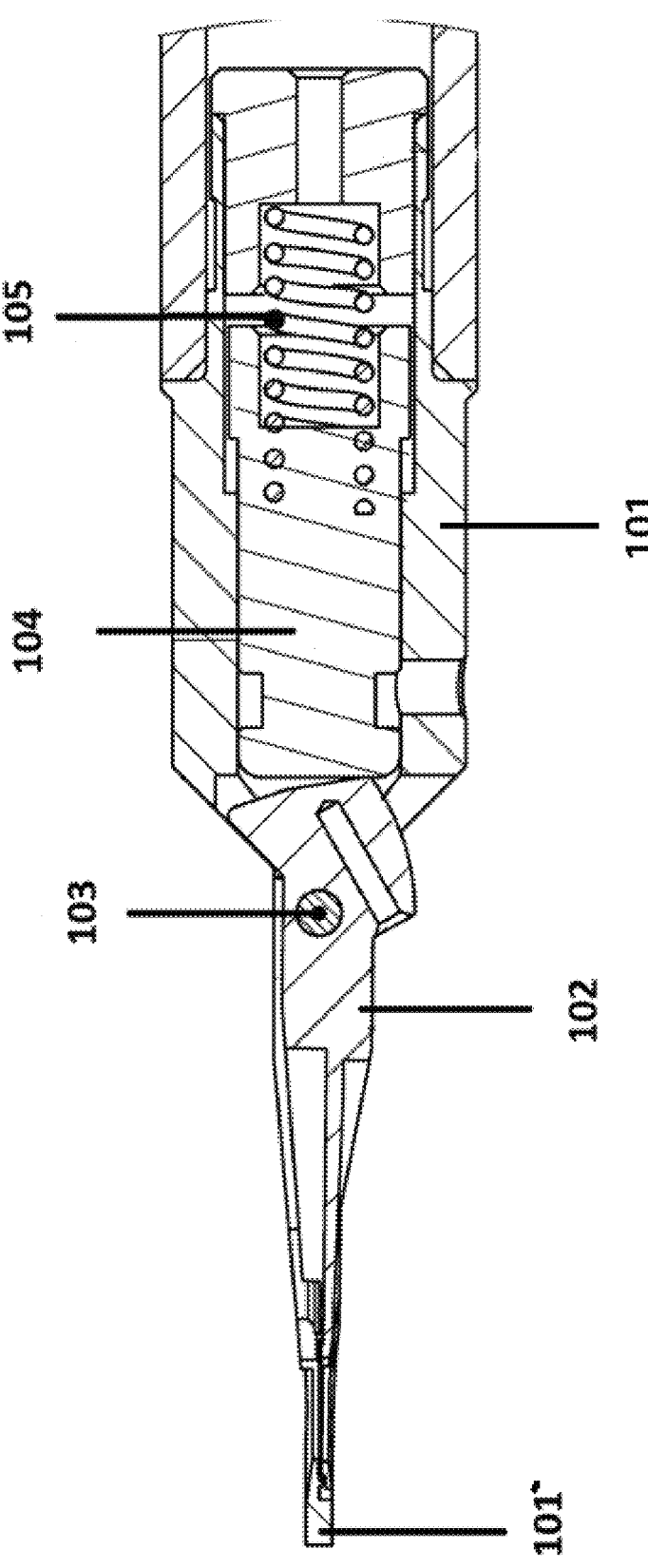
FIG. 2 is a schematic overview of a sample holder tip within the scope of the invention in the closed position.
Figure 3:
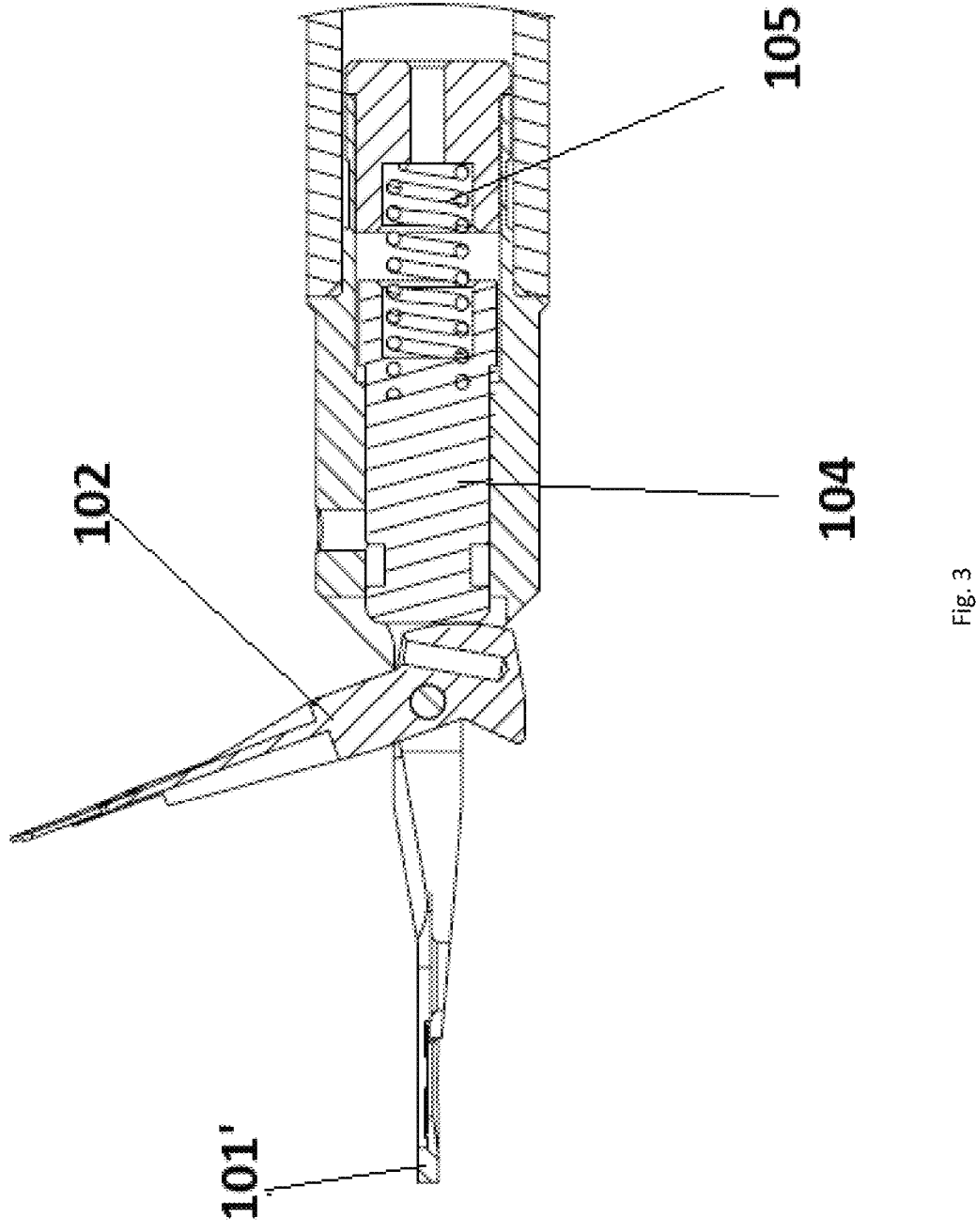
FIG. 3 is a schematic overview of a sample holder tip within the scope of the invention in the open position.

FIG. 2 and FIG. 3 show an embodiment of the sample holder tip according to the present invention, which can be used in a charged particle microscope as shown in FIG. 1; but is equally applicable for a SEM or FIB device.

The sample holder tip comprises an elongated member (101) that is connectable to the stage A' of the positioning device A as shown in FIG. 1. At the outer (distal) end (101') of the elongated member a sample receiving zone is provided.

The clamping mechanism (102) is moveably connected to the elongated member (101) for fixing a sample in the sample receiving zone. The clamping arm of the clamping mechanism is moveable between an open position (as shown in FIG. 3) and closed position (as shown in FIG. 2). In the open position the clamping arm is moved away from the sample receiving zone, such that it enables the sample or sample carrier to be placed in the sample receiving zone. In the closed position, the distal end of the clamping arm is positioned within the sample receiving zone in the elongated member.

In the figures shown, the clamping arm comprises a pivot (103), and is pivotable between the open position and the closed position.

A spring element (105) provides a force to hold the clamp in the closed position via body (104). The body is configured such that in the closed position the force from the spring maintains the closed position, but when the clamp is opened more than 20 degrees from the closed position, the force from the spring maintained the clamp in an open position as shown in FIG. 3.

Figure 5:
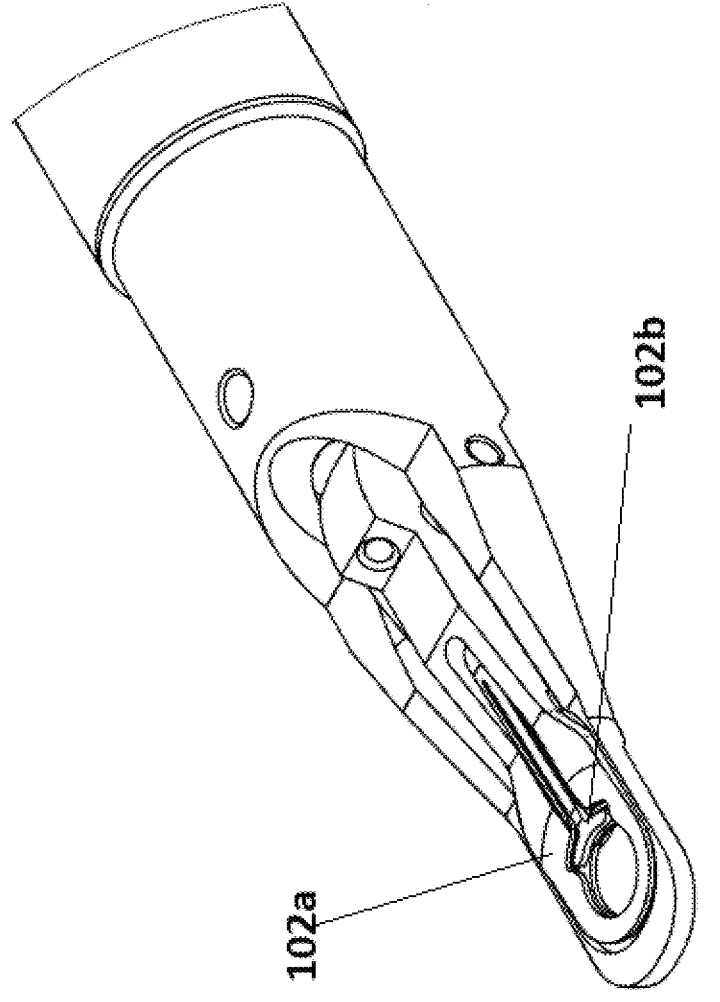
FIG. 5 is a schematic overview of a sample holder tip within the scope of the invention in the closed position showing a first and second clamping arm.

FIG. 5 shows an embodiment of the invention where the clamping member comprises a first clamping are (102*a*) and a second clamping arm (102*b*). As shown, the second clamping arm may be moveable connected to the first clamping arm, such that the second clamping arm sits within the first clamping arm.

EXAMPLES

Example 1—Calculation of Theoretical Values for the Collection Angle for Sample Holders of the Prior Art Compared to a Sample Holder Comprising a Tip of the Present Invention The collection angle was calculated by projecting a point on the sample towards the detector surfaces and subtracting the area of this projection which is blocked by the sample holder geometry.

Figure 4:
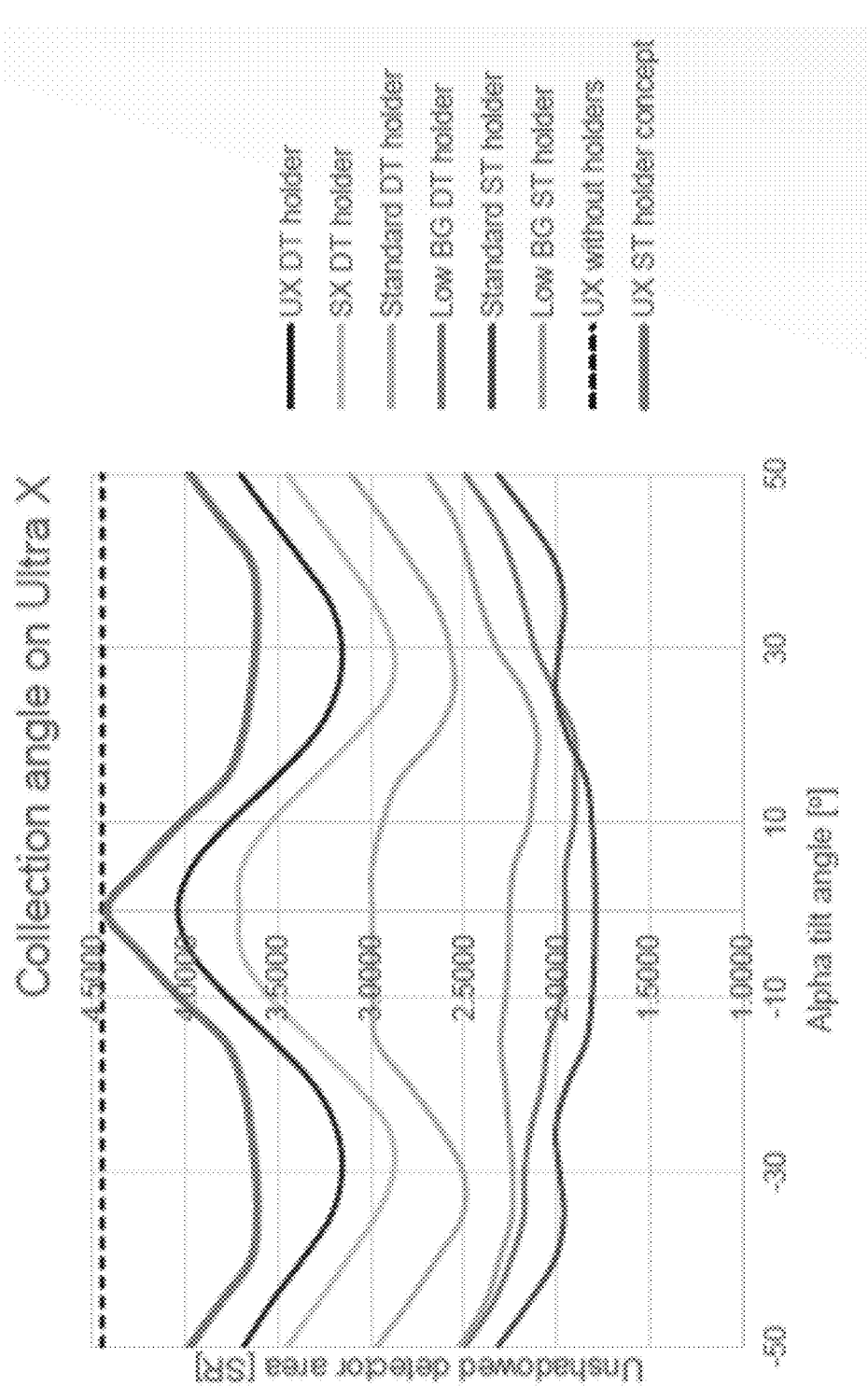
FIG. 4 is a graph comparing the tilt angles obtained using holder of the prior art and those obtained using a holder tip of the invention.

FIG. 4 shows the theoretical calculated values for the collection angle (also called solid angle) (expressed in steradians [SR]) of an Ultra X in combination with various sample holders over an alpha tilt (rotation along the axis of the holder) range from −50 to +50 degrees.

See: https://en.wikipedia.org/wiki/Solid_angle

The invention claimed is:

1. A sample holder tip for use in a charged particle microscope, wherein the sample holder tip comprises:
   an elongated member having a proximal and a distal end, wherein a sample receiving zone for releasably receiving a sample is provided near the distal end of the elongated member; and
   a clamping mechanism for fixing the sample in said sample receiving zone of said elongated member, wherein the clamping mechanism is moveably connected to the elongated member and comprises at least a first clamping arm with a distal and proximal end, wherein the first clamping arm is movable between a closed and open position, wherein in the open position said sample can be placed in ore removed from said sample receiving zone, and when in said closed position said sample can be locked in said sample receiving zone; characterised in that the first clamping arm is moveably connected to the elongated member at the proximal end of the elongated member;
   wherein the clamping mechanism further comprises a second clamping arm moveably connected at the proximal end of the elongated member; and
   wherein the second clamping arm is positioned within the first clamping arm and provides a clamping force against the perimeter of the sample when in a closed position that is separate to the first clamping arm.

2. A sample holder tip according to claim 1, wherein the proximal end of the first clamping arm is moveably connected to the elongated member and at least a portion of the distal end of the first clamping arm is configured to fit within the sample receiving zone and provide a clamping force against the perimeter of the sample when in a closed position.

3. A sample holder tip according to claim 2, wherein at least half of the distal end of the first clamping arm is configured to fit within the sample receiving zone and provide a clamping force against the perimeter of the sample when in a closed position.

4. A sample tip according to claim 1, wherein the distal end of the second clamping arm is configured to fit within the sample receiving zone and provide a clamping force against the perimeter of the sample when in a closed position.

5. A sample tip according to claim 1, wherein when the first clamping arm or the first and second clamping is arms are in the closed position, the distal end of the first clamping arm or the first and second clamping arms provides a clamping force on the full perimeter of the sample.

6. A sample tip according to claim 5, wherein the first clamping arm provides a clamping force against from about 60% to about 80% of the perimeter of the sample and the second clamping arms arm provides a clamping force against from about 20% to about 40% of the perimeter of the sample.

7. The sample holder tip according to claim 1, wherein the tip further comprises a spring element for providing a force to urge the at least a first clamping arm to the closed position.

8. A sample holder tip according to claim 7, wherein the tip further comprises a body situated between the spring element and the first clamping arm or the first and second clamping arms and the body transfers the force provided by the spring element to the first clamping arm or the first and second clamping arms through contact between the body and the proximal end of the first clamping arm or the first and second clamping arms.

9. A sample holder tip according to claim 1, wherein the first clamping arm or the first and second clamping arms are pivotable between said open and said closed position.

10. A sample tip according to claim 9, wherein pivots of the first and second clamping arms may be located at the same position on the elongated member or in a different position on the elongated member.

11. A sample tip according to claim 9, wherein a pivot of the second clamping arm is located in the middle of the first clamping arm.

12. The sample holder tip according to claim 1, wherein the tip is connected to a charged particle microscope by a member type body or a cartridge type body.

13. A sample holder comprising a sample holder tip as defined in claim 1.

14. A charged particle microscope comprising a radiation source, an illuminator, a sample holder tip as defined in claim 1, and a detector.

15. A method of placing a sample in the sample holder tip as defined in claim 1, wherein the method comprises the steps of moving said first clamping arm to said open position, placing said sample in said sample receiving zone of said sample holder or tip, and moving said first clamping arm to said closed position.

16. A sample holder tip for use in a charged particle microscope, wherein the sample holder tip comprises:
   an elongated member having a proximal and a distal end, wherein a sample receiving zone for releasably receiving a sample is provided near the distal end of the elongated member; and
   a clamping mechanism for fixing the sample in said sample receiving zone of said elongated member, wherein the clamping mechanism is moveably connected to the elongated member and comprises at least a first clamping arm with a distal and proximal end, wherein the first clamping arm is movable between a closed and open position, wherein in the open position said sample can be placed in ore removed from said sample receiving zone, and when in said closed position said sample can be locked in said sample receiving zone; characterised in that the first clamping arm is moveably connected to the elongated member at the proximal end of the elongated member;
   wherein the first clamping arm or the first and second clamping arms are pivotable between said open and said closed position; and
   wherein a pivot of the second clamping arm is located in the middle of the first clamping arm.

* * * * *